United States Patent [19]

Gould et al.

[11] Patent Number: 5,341,310
[45] Date of Patent: Aug. 23, 1994

[54] WIRING LAYOUT DESIGN METHOD AND SYSTEM FOR INTEGRATED CIRCUITS

[75] Inventors: Scott W. Gould, Burlington; Mark G. Marshall, Essex Junction; Patrick E. Perry, Colchester, all of Vt.

[73] Assignee: International Business Machines Corporation, Armonk, N.Y.

[21] Appl. No.: 809,681

[22] Filed: Dec. 17, 1991

[51] Int. Cl.$^5$ ............ H01L 21/02; G06F 15/20
[52] U.S. Cl. ............... 364/491; 364/488; 364/489; 364/490
[58] Field of Search ................ 364/488–491

[56] References Cited

U.S. PATENT DOCUMENTS

| | | | |
|---|---|---|---|
| 4,295,149 | 10/1981 | Balyoz et al. | 357/45 |
| 4,484,292 | 11/1984 | Hong et al. | 364/491 |
| 4,500,963 | 2/1985 | Smith et al. | 364/300 |
| 4,613,941 | 9/1986 | Smith et al. | 364/490 |
| 4,615,010 | 9/1986 | Davis et al. | 364/491 |
| 4,615,011 | 9/1986 | Linsker | 364/491 |
| 4,700,316 | 10/1987 | Nair | 364/488 |
| 4,742,471 | 5/1988 | Yoffa et al. | 364/491 |
| 4,745,084 | 5/1988 | Rowson et al. | 437/51 |
| 4,752,887 | 6/1988 | Kuwahara | 364/491 |
| 4,782,193 | 11/1988 | Linsker | 174/68.5 |
| 4,825,107 | 4/1989 | Naganuma et al. | 307/465 |
| 4,829,014 | 5/1989 | Yerman | 437/8 |
| 4,849,904 | 7/1989 | Aipperspach et al. | 364/489 |
| 4,852,015 | 7/1989 | Doyle, Jr. | 364/491 |
| 4,855,929 | 8/1989 | Nakajima | 364/490 |
| 4,890,238 | 12/1989 | Klein et al. | 364/491 |
| 4,910,680 | 3/1990 | Hiwatashi | 364/491 |
| 5,019,997 | 5/1991 | Haller | 364/488 |
| 5,060,116 | 10/1991 | Grobman et al. | 361/474 |

FOREIGN PATENT DOCUMENTS 59-36942 of 1984 Japan.
2-62676 of 1990 Japan.

OTHER PUBLICATIONS

Feth et al., "High-Density Cell Layout Design for VLSI Semiconductor Chips", IBM Technical Disclosure Bulletin, vol. 27, No. 11, pp. 6741–6744, 1985.
Curtin et al., "Chip-Redundant Wiring Technique", IBM Technical Disclosure Bulletin, vol. 27, No. 12, pp. 7225–7226, 1985.
Bajuk et al., "Borderless Gate Contacts for CMOS Applications", IBM Technical Disclosure Bulletin, vol. 32, No. 3B, pp. 71–73, 1989.
Ishikawa et al., "Compaction Based Custom LSI Layout Design Method", IEEE Computer Society, Nov. 18–21, 1985, IEEE International Conference on Computer-Aided Design, pp. 343–345.
Anderson et al., "Chip Design Exclusively by Programs", IBM Technical Disclosure Bulletin, vol. 32, No. 3B, pp. 417–418, 1989.
R. S. Rutter, "Method to Improve Chip Wiring", IBM Technical Disclosure Bulletin, vol. 32, No. 4B, pp. 290–293, 1989.
Dennean et al., "Wiring Machine", IBM Technical Disclosure Bulletin, vol. 24, No. 11A, pp. 5377–5383, 1982.
Berndlmaier et al., "Optimizer Chip Cell Organiza- (List continued on next page.)

*Primary Examiner*—Thomas G. Black
*Assistant Examiner*—Leigh Marie Garbowski
*Attorney, Agent, or Firm*—Heslin & Rothenberg

[57] ABSTRACT

A wiring layout design method and system providing efficient routing of wiring paths between multiple function blocks in an integrated circuit is disclosed. Associated with the function blocks are logic service terminals (LSTs) aligned on-grid relative to the global wiring layout. The technique utilizes a locator designating a desired contact point for each on-grid LST to be connected. The contact point designation is made without restriction relative to the predetermined grid pattern of the logic service terminals. Subsequent use of a conventional global wiring layout program to generate a layout of connections between LSTs, a reformatting program connects each wired logic service terminal to its desired contact point on the associated function block using the corresponding locator.

19 Claims, 4 Drawing Sheets

OTHER PUBLICATIONS tion", IBM Technical Disclosure Bulletin, vol. 21, No. 4, pp. 1463, 1978.

Hauge et al., "Procedure for Hierarchical Chip Physical Design", IBM Technical Disclosure Bulletin, vol. 28, No. 5, pp. 1981–1985, 1985.

Coppersmith et al., "Improved Local Wiring of Movable Terminals in VLSI Chips", IBM Technical Disclosure Bulletin, vol. 26, No. 12, pp. 6315–6317, 1984.

Kurtzberg et al., "Estimating Chip Wirability by Routing Configuration Averaging", IBM Technical Disclosure Bulletin, vol. 26, No. 5, pp. 2625–2633, 1983.

WIRING LAYOUT DESIGN METHOD AND SYSTEM FOR INTEGRATED CIRCUITS

TECHNICAL FIELD

This invention relates in general to automated wiring layout techniques for integrated circuits, and more particularly, to a novel design method and system for efficiently routing wiring paths between multiple function blocks in an integrated circuit while minimizing both transistor gate pitch on the function blocks and global wiring grid pitch.

BACKGROUND ART

Most conventional wire routing design programs produce a wire layout connecting certain predefined locations or points (herein referred to as logic service terminals or LSTs), which typically reside in alignment with a predetermined fixed grid pattern. Traditionally, these on-grid logic service terminals have been aligned over the particular input structure (such as a transistor gate) or output structure (e.g., an output diffusion) of the function block to be connected within the circuit.

By way of example, FIG. 1 depicts a fixed wiring grid layout 12 wherein a first global metallization layer (M1) is arranged in a horizontal direction and a second global metallization layer (M2) is arranged substantially orthogonal thereto such that a grid of intersecting points 10 is defined. Most wire routing programs assume that the connect locations (LSTs) are on-grid, i.e., aligned with points 10. (Traditionally, wiring comprising a third global metallization level (M3) (not shown) is also used. This third level would substantially align with metallization level (M1).) In one implementation, the first level metal (M1) is shared between function block wiring and horizontal global wiring, the second level metal (M2) is used for vertical global wiring and the third level metal (M3) (not shown) is used for further horizontal global wiring.

Typically, each function block to be wired in an integrated circuit typically contains at least one, and normally more than one, logic service terminal (LST). These LSTs identify a particular location on the associated function block where the wiring layout can connect to either an input structure or output structure, such as a transistor gate or a diffusion. Typically, each function block has multiple transistor gates to be wired within the circuit, either to structures within the function block or globally. Where multiple transistor gates per function block exist, the pitch of the gates and the pitch of the second level metal (M2) have traditionally been maintained the same in order that the gate structures align with the LSTs of the global wiring grid for ready connection thereto. Unfortunately, for a given technology, optimum wiring pitch for the second metal level (M2) (which again operates in part to define the wiring grid) is often different than the optimum pitch of a function block's transistor gates. For example, a preferred second level metal (M2) pitch may be 2.4 microns, while an optimum gate pitch may be 2.6 microns. There are several known approaches to addressing this problem, but each has its own disadvantages.

One approach is to simply increase the second level metal (M2) pitch to that of the transistor gate pitch, e.g., to 2.6 microns. However, this results in fewer available global wires on the most critical wiring level (i.e., the vertical global wiring level) and therefore a reduced chip density. Another possible technique is to reduce the global wiring grid to a value that is a factor of both the transistor gate and the global wiring pitches. For example, the gate pitch could be changed to 3.2 microns and the grid pitch to 0.8 microns, or the gates could be left at 2.6 microns pitch and the grid pitch changed to 0.2 microns. However, either change produces a much greater data volume for the wiring design program, and therefore reduced performance. In addition, the first suggested change also results in a reduced chip density.

A further approach is to leave the second metal level (M2) and gate pitches at 2.4 microns and 2.6 microns, respectively, and to place the logic service terminals in alignment with grid points by appropriately configuring the gates. FIG. 2 is a simplified depiction of a function block 20 constructed using this approach. Block 20 includes three input gate structures 22a, 22b and 22c, which reside over two separate diffusions 23. Gate 22a has three logic service terminals 24a associated therewith, while gates 22b and 22c each have two logic service terminals 24b and 24c, respectively. Few LSTs per gate are possible since according to this approach the LSTs can only be positioned in alignment with the wiring grid (not shown). This complicates the wiring layout process and results in a lower utilization of silicon area.

In view of the identified problems associated with the known on-grid approaches, an off-grid wiring layout technique is considered desirable. One commercially available wiring tool provides for global wiring layout wherein the logic service terminals are located off-grid relative to the global wiring. This product is marketed by Cadence Design Systems, Inc. of San Jose, Calif. under the Trademark CELL3. Unfortunately extensive run times are required to operate the program when the LSTs are off-grid, causing some chip physical designers not to take advantage of this aspect of the CELL3 wiring tool.

Therefore, a more efficient approach to producing a wiring layout wherein desired contacts are off-grid is needed, and particularly one which allows minimum pitch for both gates and wires, a plurality of logic service terminals along an entire gate and much greater flexibility for the circuit designer. The present invention provides such a wiring layout design technique.

DISCLOSURE OF INVENTION

Briefly described, in one aspect of the present invention a method for designing a wiring layout to connect function blocks in an integrated circuit is provided. Each of the function blocks is assumed to have at least one logic service terminal associated therewith for facilitating layout wiring thereof. The logic service terminals are aligned with a predetermined grid pattern (e.g., the global wiring grid to be formed for the given technology). The design method includes the steps of: generating for each of the logic service terminals a corresponding locator designating a desired contact point for wiring from the logic service terminal to the associated function block, the contact point designation being without restriction relative to the predetermined grid pattern of the logic service terminals; generating a global wiring layout to connect function blocks in the integrated circuit, the generated global wiring layout connecting at least some of the logic service terminals aligned with the predetermined grid pattern; and reformatting the global wiring layout to route wiring from each connected logic service terminal to its corresponding desired contact point on the associated function block using the generated locators. In one specific embodiment, the locators include a dummy contact point and a dummy metal shape interconnecting the corresponding logic service terminal and dummy contact point. In this embodiment, the reformatting step includes for each logic service terminal connected in the wiring layout, turning the associated dummy contact point real, and turning the interconnecting dummy metal shape real. Additional specific details of the method, as well as alternate embodiments thereof, are also described and claimed.

In another aspect, the present invention comprises a design system for producing a wiring layout to connect function blocks in an integrated circuit. The design system includes a computer database which contains representations of each function block to be connected in the integrated circuit. For each function block, at least one logic service terminal is associated therewith. The logic service terminals are assumed to be in alignment with a predetermined grid pattern. The computer database further includes for each logic service terminal a locator which designates a desired contact point for wiring from the logic service terminal to the associated function block. The contact point designations are without restriction relative to the predetermined grid pattern of the logic service terminals. Generating means is also provided for producing a global wiring layout connecting function blocks in the integrated circuit using at least some of the function blocks in the computer database. The generated global wiring layout connects at least some of the logic service terminals of the connected function blocks. The system also includes reformatting means for rerouting wiring from each connected logic service terminal to the corresponding desired contact point on the associated function block using the locators contained within the computer database.

The novel design method and system set forth herein provide for efficient routing of wiring paths between multiple function blocks contained within an integrated circuit. The technique allows the minimization of both global wiring grid pitch and transistor gate pitch on the function blocks. Further, a plurality of logic service terminals may be provided along the entire transistor gate structure providing the circuit designer with significantly greater flexibility than most prior art wiring layout design techniques. In addition, design processing time is significantly improved in comparison with the closest prior art wiring layout techniques.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Figures 1, 2:
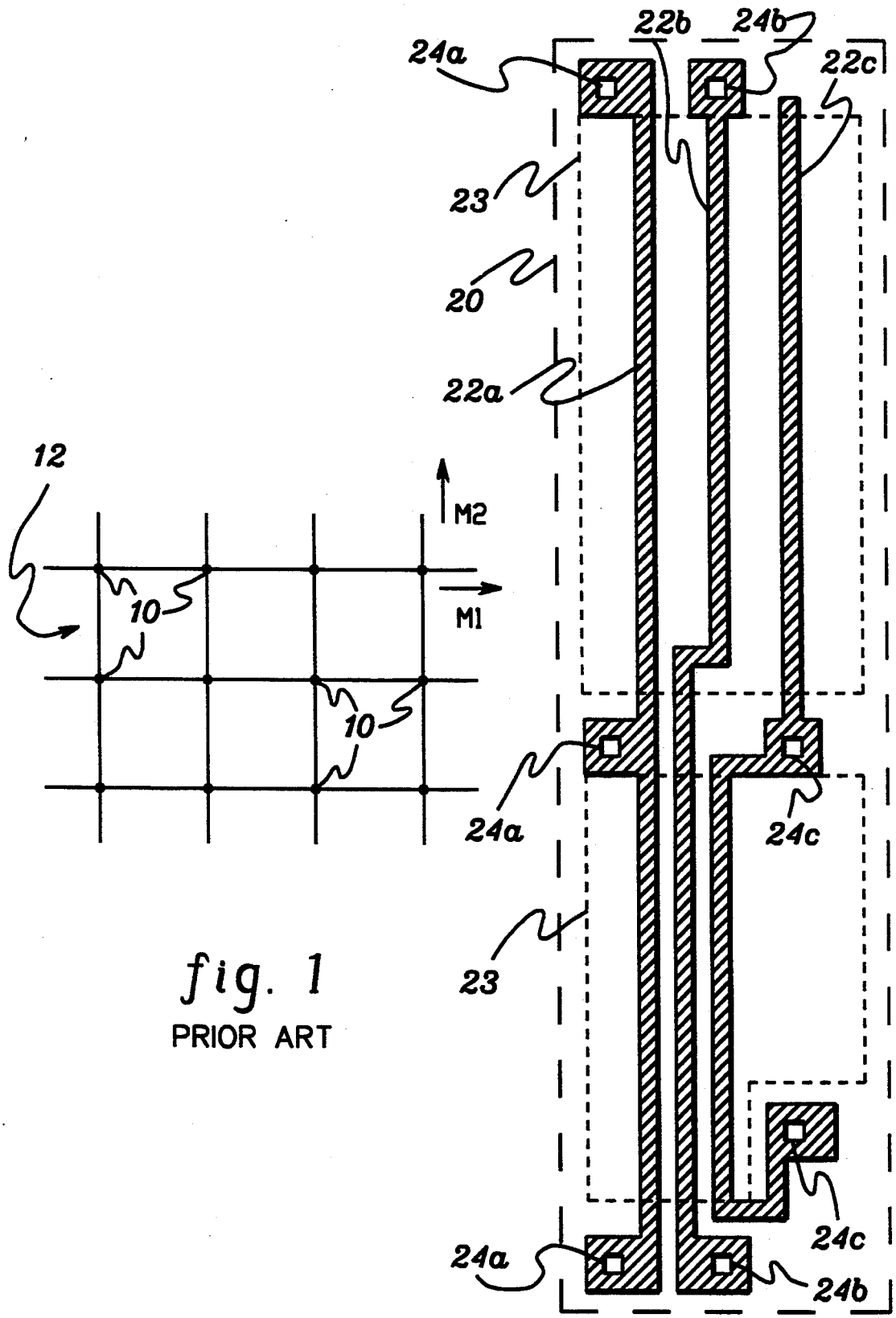
FIG. 1 is a partial plan view of a conventional, fixed wiring grid layout.
FIG. 2 is a simplified schematic of a conventional function block layout having three input gates and several associated logic service terminals.

In general, the technique described herein provides a plurality of on-grid LSTs for each off-grid input/output structure on a function block to be connected in a wiring layout. Important to the invention is the use of a locator which designates a desired contact point for connection of each on-grid LST to the corresponding off-grid input/output structure (e.g., transistor gate) on the LST's associated function block. A conventional IC wire routing program is then used to efficiently layout global connections to desired on-grid LSTs. One commercially available wiring tool for this purpose is the above-referenced CELL3 package marketed by Cadence Design Systems, Inc. of San Jose, Calif.

After accomplishing routing of wires to the on-grid LSTs, a rerouting program is used to complete the wiring layout by connecting each wired LST to its contact point (disposed on the associated input/output structure) defined by the corresponding locator. (As used herein, the term "wired" refers to connection of two points in a design layout.) The inventive approach presented advantageously uses proven, commercially available fast wiring techniques to wire the on-grid LSTs, while still ultimately providing for wiring to contact points located off-grid. Again, the invention described herein comprises a design technique for routing internal and global wiring between function blocks. Once the wiring layout is completed, fabrication of the integrated circuit proceeds essentially as with previous wiring layout configurations.

Reference is now made to the remaining figures of the drawings in which the same reference characters are used throughout the different figures to designate the same or similar components.

Figure 3:
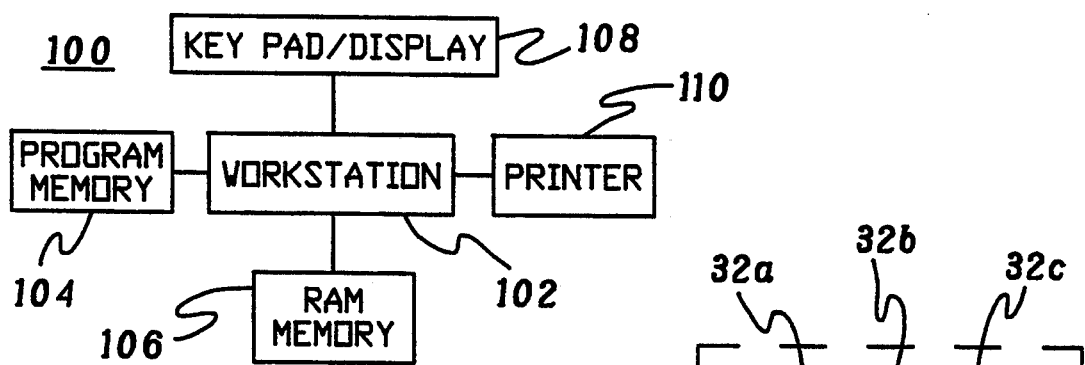
FIG. 3 is a block diagram of certain key components of a wiring layout design system pursuant to the present invention.

One structural embodiment of a wire layout processing system, generally denoted 100, pursuant to the present invention is depicted in FIG. 3. System 100 includes a workstation 102 (such as an IBM 6000 engineering workstation), which may if desired be coupled to a mainframe computer (not shown). Connected to workstation 102 is a program memory 104 which contains the global wiring tool and a rerouting program pursuant to the present invention. RAM memory 106 comprises the workstation's working memory. Input/output devices such as keypad/display 108 and printer 110 are also coupled to workstation 102 for user interface with the processing system.

Pursuant to a preferred embodiment of the present invention, a computer database (e.g., stored in memory 104) containing a representation of each function block to be incorporated into the integrated circuit is also provided. As described below, this computer database contains multiple LSTs per input/output structure of each function block to be wired, along with a corresponding locator for each LST. Again, the LSTs are located on-grid while the locators designate a contact point to the associated input/output structure located off-grid, i.e., relative to the anticipated global wiring grid based on a given technology.

Figure 5:
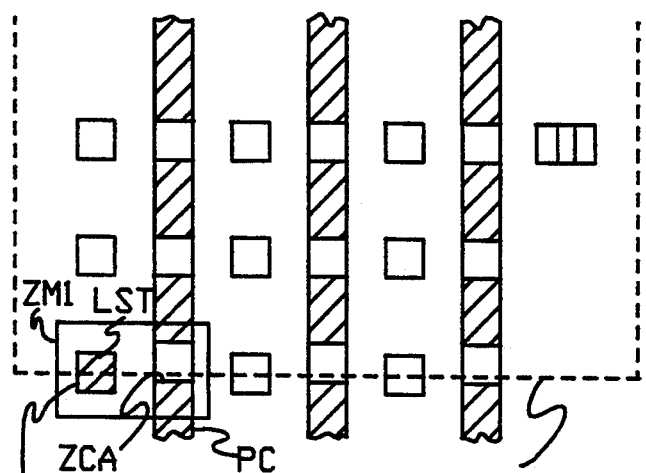
FIG. 5 is an expanded, partial view of the structures depicted in FIG. 4 showing the positioning pursuant to the present invention of logic service terminals and their paired dummy contact points relative to the three gate shapes.
Figure 4:
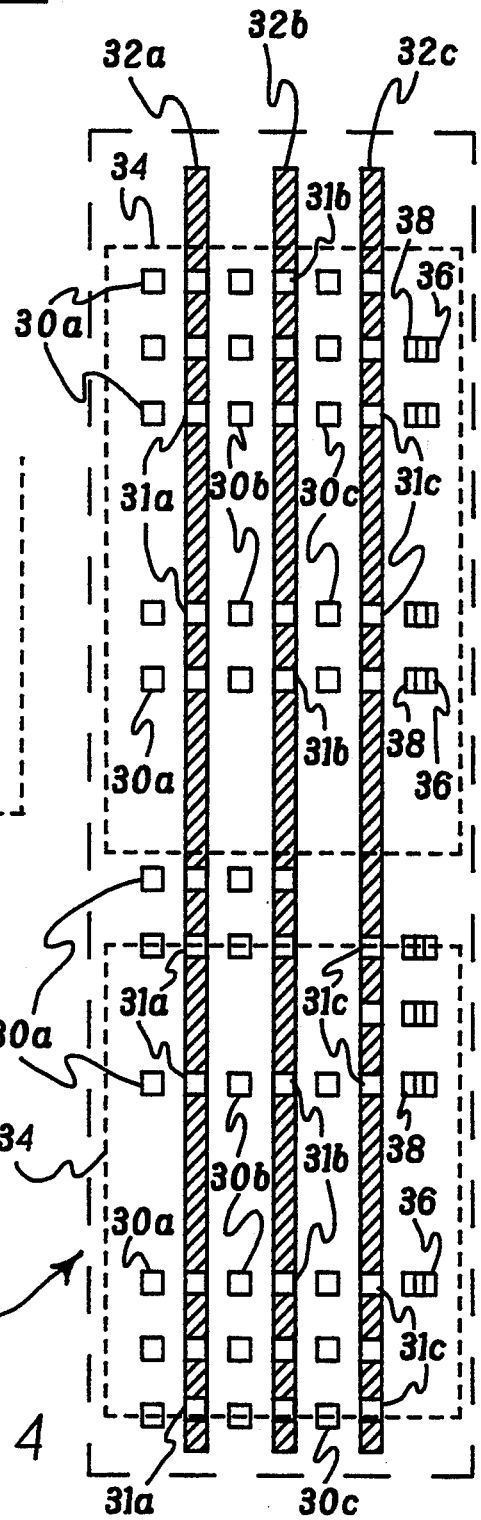
FIG. 4 is a simplified schematic of a function block layout pursuant to the present invention showing three input gates, their associated logic service terminals and associated dummy contact points.

FIGS. 4 & 5 partially depict one embodiment of representative information prestored in the computer database for one function block. As shown, block 28 includes multiple LSTs 30a, 30b and 30c for each associated transistor gate 32a, 32b and 32c, respectively. Pursuant to the invention, it is assumed that LSTs 30a, 30b and 30c are all on the global wiring grid to be formed by global metallization levels M1, M2 (not shown), while the corresponding dummy contact points 31a, 31b and 31c, respectively, are substantially all located off-grid. Most dummy contact points are disposed in alignment with a respective one of the gate structures 32a, 32b and 32c. Also shown in FIG. 4 are on-grid LSTs 36 for connecting to output diffusions 34 and their associated, overlapping dummy contact points 38. All contact points 31a, 31b, 31c and 38 shown in FIGS. 4 & 5 are assumed to be dummy contact points. Also, shown in FIG. 5 is one example of a dummy metal 1 shape (ZM1) used to interconnect an LST and its corresponding dummy contact point (ZCA). In this embodiment, each LST and corresponding dummy contact point pair is assumed to have a predefined dummy metal 1 shape interconnecting the locations. All of the LSTs, dummy contact points and associated dummy metal 1 shapes are transparent to the global wiring algorithm, i.e., until wired or turned "real" as described below.

Gate structures 32a, 32b and 32c comprise polysilicon (PC) shapes (see FIG. 5). A "wired LST" 40 is layed out to connect to the corresponding gate structure using its associated dummy metal 1 shape (ZM1) and dummy contact point (ZCA). The dummy contact point (ZCA) can be offset from the corresponding LST in both the Y-axis and X-axis directions as shown. Any appropriate ground rule or LP (logical-two-physical checking) restriction for each function block may be accommodated during the rerouting process. For example, one ground rule may be that horizontally, vertically or diagonally adjacent LSTs are not wirable simultaneously.

Figure 6:
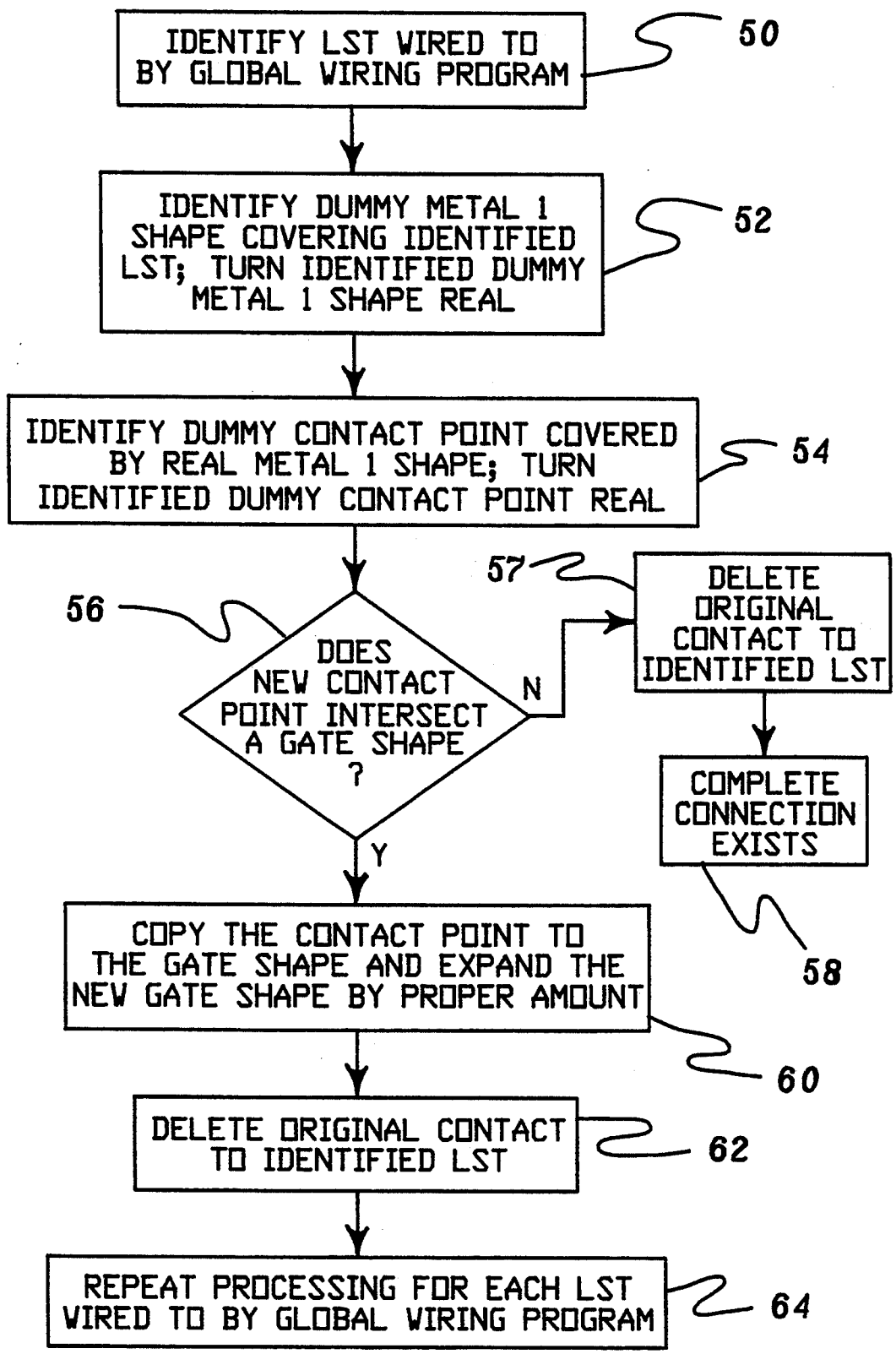
FIG. 6 is a functional overview of one post global layout rerouting method pursuant to the present invention.
Figure 7:
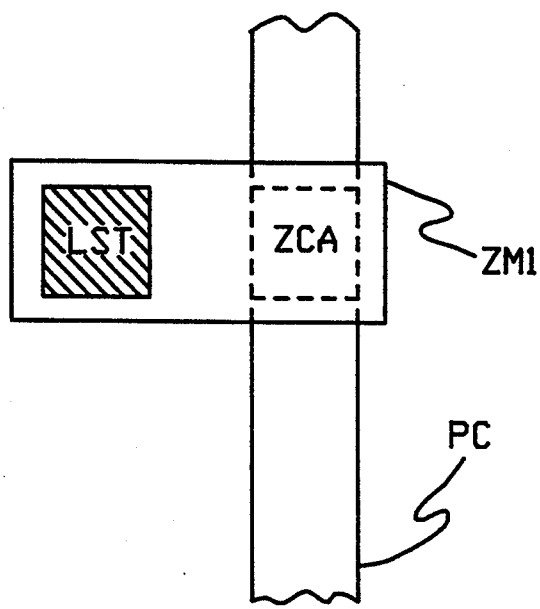
FIG. 7 is a simplified wiring diagram of one of the design levels depicted in FIGS. 4 & 5, and is useful in explaining the processing steps of FIG. 6.

An overview of one embodiment of a wire layout rerouting program pursuant to the present invention is set forth in FIG. 6. Again, pursuant to the invention rerouting is accomplished after application of a conventional global wiring program, such as the CELL3 wiring tool referenced above, to route wires between on-grid LSTs. Post global layout processing begins by identifying a connected LST in the global wiring layout, 50 "Identify LST Wired To By Global Wiring Program." Thereafter, the stored dummy metal 1 shape covering the identified LST is identified. (Again, each LST in the subject function block is predefined to have a corresponding dummy metal 1 shape, as well as a dummy contact point.) This dummy metal 1 shape (ZM1) is then turned "real" in the wiring layout, 52 "Identify Dummy Metal 1 Shape Covering Identified LST; Turn Identified Dummy Metal 1 Shape Real." In addition, the corresponding dummy contact point covered by the real metal 1 shape is identified and this dummy contact point is also turned real, 54 "Identify Dummy Contact Point Covered by Real Metal 1 Shape; Turn Identified Dummy Contact Point Real." As shown in FIG. 7, step 52 of the rerouting program directs the processor to identify dummy metal 1 shape (ZM1) and turn the level real, i.e., include the shape in the wiring layout, while step 54 directs the program to identify dummy contact point (ZCA) and turn it real, again, include the point in the wiring layout.

After incorporating the appropriate metal 1 shape and contact point into the layout wiring (i.e., designating these shapes as real), inquiry is made as to whether the new contact point intersects a gate shape, 56 "Does New Contact Point Intersect a Gate Shape?" If "no", then the connected LST has been coupled in the layout design to an appropriate input/output structure of the associated function block and the original contact to the identified LST is deleted (e.g., redefined as a dummy level), 57 "Delete Original Contact To Identified LST." Processing for that LST is then completed, 58 "Complete Connection Exists." For example, if the new contact point intersects a diffusion, processing is completed.

Figure 8:
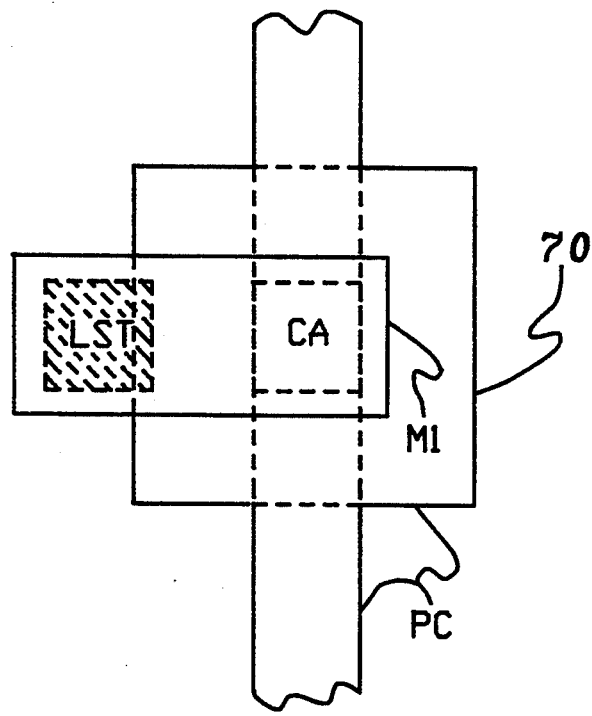
FIG. 8 is a simplified wiring diagram showing completed connection of an LST to a transistor gate pursuant to the processing steps of FIG. 6.

Alternatively, if the contact point intersects a gate shape, then additional processing is preferred. Initially, flow from inquiry 56 is to instruction 60 "Copy The Contact Point to the Gate Shape and Expand The New Gate Shape By Proper Amount." By way of example, one possible result of this operation is depicted in FIG. 8, wherein the contact point is designated (CA). This new shape is "incorporated" into the gate shape and then expanded, for example, to a square the size of shape 70. This expanded gate shape is considered desirable to ensure that metallization contact is ultimately made to the polysilicon gate. This is because as described above the originally identified contact point may be somewhat offset from the initial polysilicon gate shape (PC) (see FIG. 7). Thereafter, the original contact point (CA) corresponding to the identified LST is deleted, 62 "Delete Original Contact to Identified LST." Finally, the rerouting processing of FIG. 6 is repeated for each LST connected in the wiring layout by the global wiring program, 64 "Repeat Processing for Each LST Wired To By Global Wiring Program."

Those skilled in the art will recognize from the above description that a novel design method and system have been provided for efficient routing of wiring paths between multiple function blocks defined in an integrated circuit. The technique allows the minimization of both global wiring grid pitch and transistor gate pitch on the function blocks. Further, a plurality of logic service terminals may be provided along the entire transistor gate structure providing the circuit designer with significantly greater flexibility. In addition, design processing time is significantly improved in comparison with the closest prior art wiring layout technique.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A method for designing a wiring layout to connect multiple function blocks in an integrated circuit, each of said function blocks having at least one logic service terminal associated therewith for facilitating layout wiring thereof, said logic service terminals aligning with a predetermined grid pattern, said design method comprising the steps of:
  (a) generating for each of said logic service terminals a corresponding locator designating a desired contact point for wiring from the logic service terminal to the associated function block, said contact point designation being irrespective of said predetermined grid pattern of said logic service terminals, such that at least some said desired contact points are located off-grid relative to said predetermined grid pattern;
  (b) generating a global wiring layout to connect function blocks of said integrated circuit, said generated global wiring layout connecting to multiple logic service terminals of said logic service terminals aligned with said predetermined grid pattern; and
  (c) reformatting said global wiring layout to route wiring from each connected logic service terminal to its desired contact point on the associated function block using said corresponding locators generated in step (a).

2. The wiring layout design method of claim 1, wherein said generating step (b) includes generating said global wiring layout using a conventional algorithm for routing of global wiring between on-grid logic service terminals.

3. The wiring layout design method of claim 1, wherein each of said function blocks includes at least an input structure or an output structure to be connected in said integrated circuit via said wiring layout, multiple logic service terminals being associated with each input structure to be connected in the wiring layout, and multiple logic service terminals being associated with each output structure to be connected in the wiring layout, and wherein said desired contact points generated in step (a) comprise dummy contact points which are transparent to said global wiring layout generating step (b).

4. The wiring layout design method of claim 3, wherein said generating step (a) further includes generating for each logic service terminal and corresponding dummy contact point an interconnecting dummy metal shape, said interconnecting dummy metal shapes being transparent to said global wiring layout generating step (b).

5. The wiring layout design method of claim 4, wherein for each logic service terminal connected in said global wiring layout, said reformatting step (c) includes reformatting said global wiring layout by transforming the corresponding dummy contact point to a real contact point and the dummy metal shape to a real metal shape interconnecting said real contact point and said connected logic service terminal.

6. The wiring layout design method of claim 5, wherein multiple output structures of said connected output structures in said function blocks comprise output diffusions and wherein said transforming produces for each of said output diffusions at least one associated real contact point in direct interface therewith.

7. The wiring layout design method of claim 5, wherein multiple input structures of said connected input structures in said function blocks comprise transistor gates and wherein for each transistor gate to be connected said reformatting step (c) includes designating the corresponding dummy contact point a new part of said gate and expanding said newly designated gate part by an amount sufficient to ensure connection of the associated logic service terminal to said transistor gate.

8. A method for designing a wiring layout to connect a function block in an integrated circuit, said function block having at least one logic service terminal associated therewith for facilitating layout wiring thereof, said logic service terminal being aligned with a predetermined grid pattern, said design method comprising the steps of:
  (a) generating for said logic service terminal a corresponding locator designating a desired contact point for wiring from the logic service terminal to the associated function block, said contact point designation being irrespective of said predetermined grid pattern of said logic service terminal, such that at least some said desired contact points are located off-grid relative to said predetermined grid pattern;
  (b) generating a global wiring layout to connect said function block in said integrated circuit, said generated global wiring layout connecting to said at least one logic service terminal aligned with said predetermined grid pattern; and
  (c) reformatting said global wiring layout to route wiring from said connected logic service terminal to its desired contact point on the associated function block using said corresponding locator generated in step (a).

9. A method for designing a wiring layout to connect function blocks in an integrated circuit, said design method comprising the steps of:
  (a) defining at least one logic service terminal for each function block of said integrated circuit, said logic service terminals facilitating wiring to said associated function blocks, said defining step including defining said logic service terminals such that each terminal is in alignment with a predetermined grid pattern;
  (b) generating for each of said on-grid logic service terminals a corresponding locator designating a desired contact point for wiring from the logic service terminal to the associated function block, said contact point designation being irrespective of said predetermined grid pattern, such that at least some said desired contact points are located off-grid;
  (c) generating a global wiring layout to connect function blocks in said integrated circuit, said generated global wiring layout connecting to multiple logic service terminals of said logic service terminals aligned with said predetermined grid pattern; and
  (d) reformatting said global wiring layout to route wiring from each connected logic service terminal to the corresponding contact point on the associated function block using said locators generated in step (b).

10. The wiring layout design method of claim 9, wherein all of said contact points generated in step (b) are off-grid relative to said predetermined grid pattern.

11. The wiring layout design method of claim 9, wherein said desired contact points generated in step (b) comprise dummy contact points which are transparent to said global wiring layout generating step (c).

12. The wiring layout design method of claim 9, wherein said generating step (b) further includes generating for each logic service terminal and corresponding desired contact point an interconnecting dummy metal shape, said interconnecting dummy metal shapes being transparent to said global wiring layout generating step (c).

13. The wiring layout design method of claim 12, wherein for each logic service terminal connected in said global wiring layout generating step (c), said reformatting step (d) includes reformatting said global wiring layout by transforming the corresponding dummy contact point to a real contact point and the corresponding dummy metal shape to a real metal shape interconnecting said real contact point and said connected logic service terminal.

14. A method for designing a wiring layout to connect function blocks in an integrated circuit, said design method comprising the steps of:
(a) providing a computer database representative of each function block to be connected in said integrated circuit, said computer database including for each of said function blocks at least one logic service terminal associated therewith for facilitating layout wiring of said blocks, said logic service terminals being in alignment with a predetermined grid pattern, said computer database further including for each logic service terminal a locator designating a desired contact point for wiring from said logic service terminal to the associated function block, said contact point designations being irrespective of said predetermined grid pattern of said logic service terminals, such that at least some said desired contact points are located off-grid relative to said predetermined grid pattern;
(b) generating a global wiring layout to connect function blocks in said integrated circuit using multiple function blocks of said function blocks in said computer database provided in step (a), said generated global wiring layout connecting at least some of said logic service terminals of said connected function blocks; and
(c) reformatting said global wiring layout generated in step (b) to route wiring from each connected logic service terminal to the corresponding desired contact point on the associated function block using said locators contained within the computer database provided in step (a).

15. The wiring layout design method of claim 14, wherein said generating step (b) includes generating said global wiring layout using a conventional algorithm for routing of global wiring between logic service terminals to connect their associated function blocks.

16. The wiring layout design method of claim 14, wherein said computer database provided in step (a) includes for each locator a corresponding dummy contact point and a dummy metal shape interconnecting said dummy contact point and the associated logic service terminal, said dummy contact points and said dummy metal shapes being transparent to said global wiring layout generating step (b).

17. The wiring layout design method of claim 16, wherein for each logic service terminal connected in said global wiring layout, said reformatting step (c) includes reformatting said global wiring layout by transforming the corresponding dummy metal contact point to a real contact point and the corresponding dummy metal shape to a real metal shape interconnecting said real contact point and said connected logic service terminal.

18. A design system for producing a wiring layout to connect function blocks in an integrated circuit, said design system comprising:
a computer database containing representations of each function block to be connected in the integrated circuit, said computer database including for each of said function blocks at least one associated logic service terminal, each of said logic service terminals being in alignment with a predetermined grid pattern, said computer database further including for each logic service terminal a locator designating a desired contact point for wiring from said logic service terminal to the associated function block, said contact point designations being irrespective of said predetermined grid pattern of said logic service terminals, such that at least some said desired contact points are located off-grid relative to said predetermined grid pattern;
means for generating a global wiring layout to connect function blocks in said integrated circuit using multiple function blocks of said function blocks in said computer database, said generated global wiring layout connecting at least some of said logic service terminals of said connected function blocks; and
means for reformatting said global wiring layout to route wiring from each connected logic service terminal to the corresponding desired contact point on the associated function block using said locators contained within said computer database.

19. The design system of claim 18, wherein said locator stored in said computer database for each of said logic service terminals comprises a dummy contact point and a dummy metal shape interconnecting said logic service terminal and said dummy contact point, and wherein said reformatting means includes means for reformatting said global wiring layout to route wiring from each connected logic service terminal to the corresponding desired contact point by transforming the corresponding dummy contact point to a real contact point and the corresponding dummy metal shape to a real metal shape interconnecting said real contact point and said connected logic service terminal.

* * * * *